United States Patent
Jin et al.

(10) Patent No.: US 9,018,947 B2
(45) Date of Patent: Apr. 28, 2015

(54) PIXEL AND ARRAY TEST METHOD FOR THE SAME

(75) Inventors: Guang hai Jin, Yongin (KR); Jae-Beom Choi, Yongin (KR); Kwan-Wook Jung, Yongin (KR); June-Woo Lee, Yongin (KR); Moo-Jin Kim, Yongin (KR); Jee-Hoon Kim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 276 days.

(21) Appl. No.: 13/609,453

(22) Filed: Sep. 11, 2012

(65) Prior Publication Data
US 2013/0257437 A1 Oct. 3, 2013

(30) Foreign Application Priority Data

Mar. 29, 2012 (KR) .......................... 10-2012-0032387

(51) Int. Cl.
*G01R 33/02* (2006.01)
*G01R 31/26* (2014.01)
*G09G 3/00* (2006.01)
*G09G 3/32* (2006.01)

(52) U.S. Cl.
CPC ............ *G01R 31/2635* (2013.01); *G09G 3/006* (2013.01); *G09G 3/3233* (2013.01); *G09G 2300/0819* (2013.01); *G09G 2300/0842* (2013.01); *G09G 2300/0861* (2013.01)

(58) Field of Classification Search
CPC ..... H01L 27/32; H01L 27/12; H01L 27/1214; H01L 27/3244; H01L 29/42384; G09G 3/3233; G09G 2300/0842; G09G 3/36; G09G 3/3655; G01R 31/2635; G01R 31/44
USPC .................................. 324/414, 678, 501, 658
See application file for complete search history.

(56) References Cited

U.S. PATENT DOCUMENTS

| | | | |
|---|---|---|---|
| 2003/0227262 A1* | 12/2003 | Kwon ......................... | 315/169.3 |
| 2006/0017106 A1* | 1/2006 | Suh et al. ..................... | 257/347 |
| 2006/0061380 A1* | 3/2006 | Toro-Lira ..................... | 324/770 |
| 2006/0284642 A1* | 12/2006 | Tomita ......................... | 324/765 |
| 2011/0205774 A1* | 8/2011 | Takemura ...................... | 365/72 |

FOREIGN PATENT DOCUMENTS

| | | |
|---|---|---|
| JP | 2003-337546 | 11/2003 |
| JP | 2005-149768 | 6/2005 |
| JP | 10-2009-0103340 A | 10/2009 |

\* cited by examiner

*Primary Examiner* — Tung X Nguyen
*Assistant Examiner* — Son Le
(74) *Attorney, Agent, or Firm* — Lee & Morse, P.C.

(57) ABSTRACT

A pixel includes an organic light emitting diode, a first transistor that is connected to a first power source and that supplies a driving current according to a corresponding data voltage to the organic light emitting diode, a second transistor that is connected to a scan line and that transmits the corresponding data voltage from a data line to a driving transistor according to a scan signal transmitted from the scan line, and a first capacitor including one electrode connected to a gate electrode of the first transistor. The first capacitor stores the corresponding data voltage as a first voltage and a size of the first capacitor is in a range of about 2 times to about 4 times a size of a gate insulating layer of the first transistor.

10 Claims, 5 Drawing Sheets

PIXEL AND ARRAY TEST METHOD FOR THE SAME

CROSS-REFERENCE TO RELATED APPLICATION

This application claims priority under 35 U.S.C. §119 to Korean Patent Application No. 10-2012-0032387 filed on Mar. 29, 2012, in the Korean Intellectual Property Office, and entitled "Pixel and Array Test Method For the Same," is incorporated by reference herein in its entirety.

BACKGROUND OF THE INVENTION

An organic light emitting diode display has a self-light emitting characteristic so a separate light source is not required. The organic light emitting diode display may have high quality characteristics such as low power consumption, high luminance, and high reaction speed such that it is spotlighted as a next generation display device.

SUMMARY OF THE INVENTION

Embodiments may be realized by providing an organic light emitting diode; a first transistor connected to a first power source and supplying a driving current according to a corresponding data voltage to the organic light emitting diode; a second transistor connected to a scan line and transmitting the corresponding data voltage from a data line to a driving transistor according to a scan signal transmitted from the scan line; and a first capacitor including one electrode connected to a gate electrode of the first transistor and storing the corresponding data voltage as a first voltage, wherein a size of the first capacitor is in a range between 2 times to 4 times the size of a gate insulating layer of the first transistor.

The gate insulating layer of the first transistor may be an insulating layer provided between an active layer and a gate metal layer of the first transistor. The gate insulating layers of the first capacitor and the first transistor may be coupled in series.

The second transistor may transmit the data voltage to a source electrode of the first transistor in response to the scan signal, however it is not limited thereto, and may transmit the data voltage to the gate electrode of the first transistor. The second transistor may include the gate electrode connected to the scan line, the source electrode connected to the data line, and the drain electrode connected to the source electrode of the first transistor.

The other electrode of the first capacitor may be connected to a first node connected to the drain electrode of the second transistor and the source electrode of the first transistor. The pixel may further include a third transistor including the drain electrode connected to the gate electrode of the first transistor and compensating a threshold voltage of the first transistor by corresponding to the scan signal.

The pixel may further include at least one fourth transistor at least provided between the first power source and the first transistor, and between the organic light emitting diode and the first transistor, and controlling transmission of a driving current to the organic light emitting diode according to a control signal.

Embodiments may also be realized by providing a pixel array test method for a pixel that includes a driving transistor transmitting a data signal controlling supply of a driving current to an organic light emitting diode according to a scan signal and a storage capacitor connected to the driving transistor, the method including irradiating an electron beam to an anode of the organic light emitting diode before completing the organic light emitting diode; and testing an inferiority existence of the storage capacitor based on a detection amount of secondary electrons emitted from the anode, wherein a size of the storage capacitor of the pixel is in a range between 2 times to 4 times the size of the gate insulating layer of the driving transistor.

The gate insulating layer of the driving transistor may be an insulation layer provided between an active layer and a gate metal layer of the driving transistor. In the test of the inferiority existence of the storage capacitor, a ratio of a normal voltage to an abnormal voltage based on the detection amount of the secondary electrons may be a function of capacitance of the storage capacitor and the gate insulating layer.

The storage capacitor and the gate insulating layer are coupled in series, and the ratio of the normal voltage to the abnormal voltage based on the detection amount of the secondary electrons may be $C1/(C1+C2)$. Here, C1 is the capacitance of the storage capacitor, and C2 is the capacitance of the gate insulating layer.

BRIEF DESCRIPTION OF THE DRAWINGS

Features will become apparent to those of ordinary skill in the art by describing in detail exemplary embodiments with reference to the attached drawings in which.

DETAILED DESCRIPTION OF THE EMBODIMENTS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

Constituent elements having the same structures throughout the embodiments are denoted by the same reference numerals and are described in a first embodiment. In the other embodiments, only constituent elements other than the same constituent elements will be described.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

Figure 1:
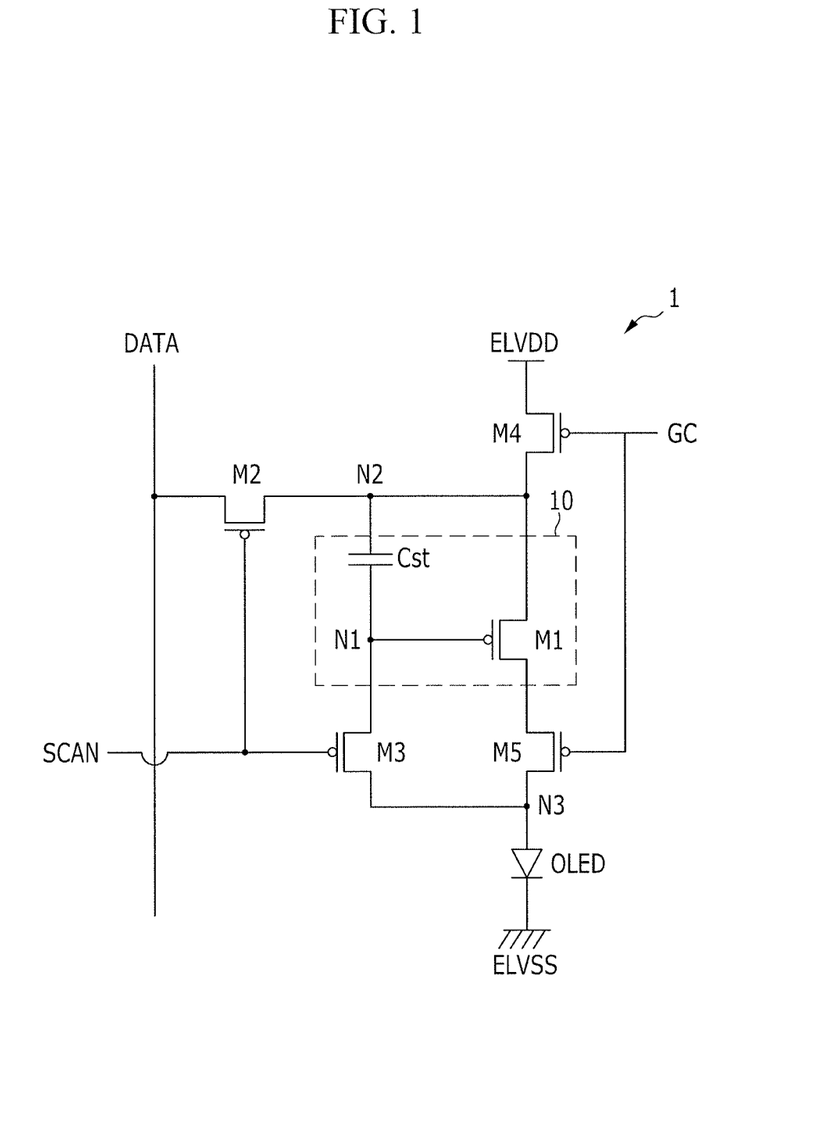
FIG. 1 illustrates a pixel circuit diagram according to an exemplary embodiment.

FIG. 1 is a pixel circuit diagram according to an exemplary embodiment.

In detail, FIG. 1 is an equivalent circuit of a unit pixel among a plurality of pixels in an array applied with a pixel array test method. The pixel circuit 1 is illustrated as a 5T1C structure including first to fifth transistors M1-M5 as five PMOS transistors and one storage capacitor Cst.

The first transistor M1 as a driving transistor includes a gate electrode connected to the first node N1, a source electrode connected to a first power source (ELVDD), and a drain electrode connected to a second power source (ELVSS). The source electrode of the first transistor M1 may further include the fourth transistor M4 connected to the first power source (ELVDD) so that the fourth transistor M4 is between the first transistor M1 and the first power source (ELVDD). For example, the source electrode of the first transistor M1 may be connected to a drain electrode of the fourth transistor M4 like FIG. 1. The drain electrode of the first transistor M1 may further include the fifth transistor M5 connected to the second power source (ELVSS) so that the fifth transistor M5 is between the first transistor M1 and the second power source (ELVSS). For example, the drain electrode of the first transistor M1 may be connected to a source electrode of the fifth transistor M5 like in FIG. 1.

The second transistor M2 may be a switching transistor including a gate electrode connected to a scan line (SCAN) transmitting a scan signal to a corresponding unit pixel, a source electrode connected to a data line (DATA) transmitting a data signal to the corresponding unit pixel, and the drain electrode connected to the second node N2.

The third transistor M3 may be a threshold voltage compensation transistor that includes a gate electrode connected to the scan line (SCAN) transmitting the scan signal to the corresponding unit pixel, a source electrode connected to the gate electrode of the first transistor M1 and one electrode of the storage capacitor Cst at the first node N1, and a drain electrode connected to an anode of an organic light emitting diode (OLED) and a drain electrode of the fifth transistor M5 at the third node N3.

The fourth transistor M4 may be a light emission control transistor that includes a gate electrode connected to a control line (GC) transmitting a control signal to control light emitting of the pixel, a source electrode connected to the first power source (ELVDD), and the drain electrode connected to the source electrode of the first transistor M1 and the other electrode of the storage capacitor Cst at the second node N2.

The gate electrode of the fifth transistor M5, e.g., as the light emission control transistor, may be connected to the control line (GC) transmitting the control signal to control the light emitting of the pixel. Further, the source electrode of the fifth transistor M5 may be connected to the drain electrode of the first transistor M1, and the drain electrode may be connected to the anode of the organic light emitting diode (OLED) and the drain electrode of the third transistor M3 at the third node N3.

The storage capacitor Cst may include one electrode connected to the gate electrode of the first transistor M1 at the first node N1 (e.g., and connected to the source electrode of the third transistor M3) and the other electrode connected to the first power source (ELVDD) (e.g., and connected to the drain electrode of the second transistor M2) so that a current is supplied to the organic light emitting diode (OLED) at the second node N2 (e.g., and at the third node N3).

The organic light emitting diode (OLED) includes an anode (e.g., a pixel electrode) connected to the drain electrode of the fifth transistor M5 and a drain electrode of the third transistor M3 at the third node N3, and the cathode (e.g., a common electrode) connected to the second power source (ELVSS).

If the corresponding scan signal is currently transmitted through the scan line (SCAN) connected to the gate electrode of the second transistor M2, in response thereto, the corresponding data signal may be transmitted to the second node N2 connected to the source electrode of the first transistor M1 through the data line (DATA) connected to the source electrode. Thus, the electrode of the storage capacitor Cst connected to the second node N2 may be applied with the data voltage according to the corresponding data signal. At this time, the corresponding data signal controls the light emitting amount of the organic light emitting diode (OLED).

The gate electrode of the third transistor M3 may be connected to the scan line (SCAN), thereby being activated by the current corresponding scan signal. Therefore, a threshold voltage compensation voltage to compensate the threshold voltage of the first transistor M1 may be transmitted to the first node N1 connected to the gate electrode of the first transistor M1. At this time, the threshold voltage compensation voltage may be applied to the electrode of the storage capacitor Cst connected to the first node N1.

Accordingly, if the corresponding scan signal is transmitted through the scan line (SCAN), the storage capacitor Cst stores the voltage by the voltage difference between both electrodes. That is, the voltage corresponding to the difference between the data voltage and the threshold voltage compensation voltage may be stored.

Next, if the control signal is transmitted through the control line (GC) connected to the gate electrode of the fourth transistor M4 of the light emission control transistor and the fifth transistor M5, the fourth transistor M4 and the fifth transistor M5 are activated and the driving current may be supplied to the organic light emitting diode (OLED), thereby forming a light-emitting state of the organic light emitting diode (OLED). The driving current, e.g., as a current corresponding to a voltage difference between the gate-source of the driving transistor M1, may be changed according to the voltage stored in the storage capacitor Cst. Accordingly, the driving current corresponds to the voltage compensating the threshold voltage of the driving transistor M1 and depending on the voltage according to the corresponding data signal.

FIG. 1 shows the pixel circuit 1 of the 5T1C structure. However embodiments are not limited thereto, e.g., the third transistor M3, the fourth transistor M4, and the fifth transistor M5 may be omitted such that the pixel circuit including a 2T1C may be applied with the array test method. In contrast, in a case that an additional transistor is connected to the transistor of FIG. 1, the array test method may be applied. Accordingly, various combinations of other transistors and capacitors replacing the circuit constitution elements may be included according to other exemplary embodiments.

In the pixel of FIG. 1, the first to fifth transistors (M1-M5) may be p-channel field effect transistors. As an example of the field effect transistor, a thin film transistor (TFT) may be used. The channel type of the first to the fifth transistors (M1-M5) may be changed into the n-channel, and in this case, waveforms of signals for driving them may be inverted.

The pixel according to an exemplary embodiment undergoes an array test process after installing the anode of the organic light emitting diode (OLED). The array test process may occur before depositing an organic light emitting layer. For example, after irradiating an electron beam (E-beam) to the anode, by detecting the secondary electrons that are again emitted and calculating a voltage value based on a detection amount of the secondary electrons, the inferiority existence of a pixel may be determined.

For example, to detect the inferiority of the storage capacitor Cst of the pixel circuit in the pixel array test method, the data voltage may or should be swung by turning on the second transistor M2 and the third transistor for M3. Accordingly, the changed voltage of the anode at this time is measured by using the electron beam, thereby detecting the inferiority of the storage capacitor Cst.

Figure 3:
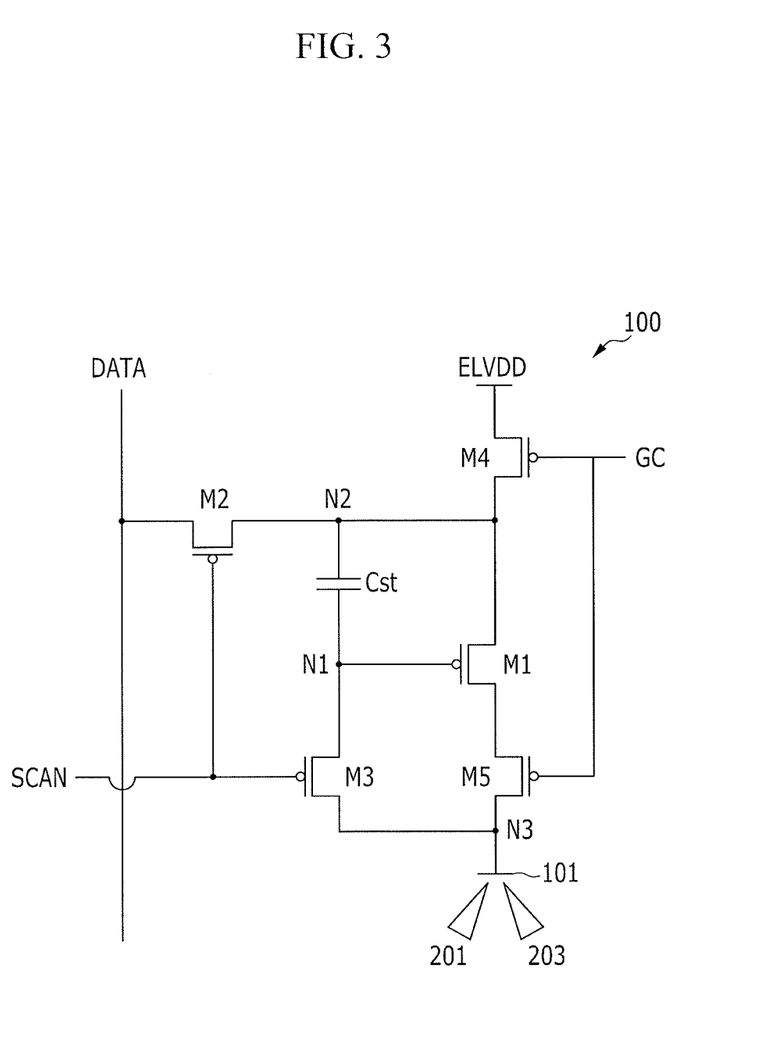
FIG. 3 illustrates a view of a shape of a pixel of FIG. 1 to which an array test method according to an exemplary embodiment is applied.

That is, as in FIG. 3, which is a view of a shape of a pixel of FIG. 1 to which a pixel array test method according to an exemplary embodiment is applied, a normal operation of the pixel may be determined based on the detection amount of the secondary electrons 203 emitted by irradiating the electron beam 201 to the anode 101.

The electrons may be equally injected to each anode of the pixels included in the pixel array so that if the driving transistor M1 of any pixel among the pixel array is not normally operated, the output value of the secondary electrons emitted from the anode of the corresponding pixel has a different value from other normal pixels.

Also, if the storage capacitor Cst of any pixel among the pixel array is not normally operated by a reason such as a short, the output value of the secondary electrons emitted from the anode of the corresponding pixel may be calculated as an abnormal voltage that is different from the normal voltage.

For example, in the case of the inferiority by the short of the storage capacitor Cst, the detection is possible by a ratio ($\Delta Vn/\Delta Vabn$) of the normal voltage and the abnormal voltage that are reflected by the change of the data signal applied to the second transistor M2. However, in such an array test device, the limitation of the ratio ($\Delta Vn/\Delta Vabn$) of the normal voltage and the abnormal voltage may be determined according to a ratio of a capacitance according to the connection structure of the storage capacitor so that the detection of the inferiority existence according to a factor such as the capacitance may not be possible.

In the pixel array test process having the structure such as for the pixel of FIG. 1, when the storage capacitor Cst connected between the first node N1 and the second node N2 is shorted, the ratio ($\Delta Vn/\Delta Vabn$) of the normal voltage and the abnormal voltage reflected by the change of the data signal is dependant on the capacitance C1 of the storage capacitor Cst and the capacitance C2 of the gate insulating layer of the driving transistor M1 connected to the first node N1.

Figure 2:
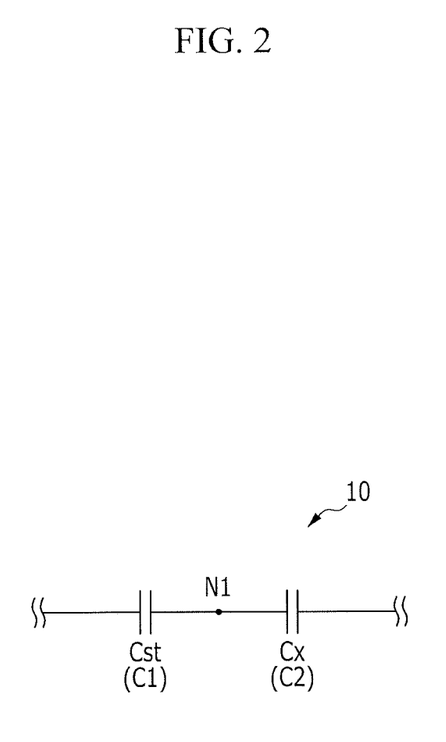
FIG. 2 illustrates a schematic diagram for one region of the pixel circuit diagram of FIG. 1.

As an equivalent circuit diagram for one region 10 of the pixel circuit diagram of FIG. 1, as shown in FIG. 2, the storage capacitor Cst and the capacitor Cx of the gate insulating layer of the driving transistor M1 are coupled in series to the first node N1. That is, the driving transistor M1 includes the gate insulating layer between the active layer and the gate metal electrode, and thereby the gate insulating layer functions as the capacitor. Like in FIG. 2, the storage capacitor Cst and the capacitor Cx of the gate insulating layer of the driving transistor M1 are coupled in series such that the voltage ratio ($\Delta Vn/\Delta Vabn$) calculated from the detection amount of the secondary electron emitted by irradiating the electron beam to the anode is dependant on $C1/(C1+C2)$. Here, C1 is the capacitance of the storage capacitor Cst, and C2 is the capacitance of the capacitor Cx of the gate insulating layer of the driving transistor M1.

As another exemplary embodiment, C2 may include each capacitance of a parasitic capacitor between the gate-source of the driving transistor M1 and a parasitic capacitor between the gate-drain of the driving transistor M1 as well as the capacitance of the capacitor Cx of the gate insulating layer of the driving transistor M1.

However, the capacitance of the parasitic capacitors may be small compared with the capacitance of the capacitor of the gate insulating layer so that it may not be considered in the calculation.

In the case of the pixel of FIG. 1, the limitation of the voltage ratio ($\Delta Vn/\Delta Vabn$) detected in the pixel array test method may be determined by $C1/(C1+C2)$ so that it may be determined that the array detection is possible according to the factor (e.g., a size of the capacitor or a distance between both electrodes) related to the capacitances of the storage capacitor Cst and the capacitor Cx of the gate insulating layer of the driving transistor M1. Accordingly, in the pixel of FIG. 1, according to an exemplary embodiment, the size of the storage capacitor Cst and the capacitor Cx of the gate insulating layer of the driving transistor M1 may be limited.

As an exemplary embodiment, the ratio (Cst/Cx) of the size of the storage capacitor Cst to the size of the capacitor Cx of the gate insulating layer of the driving transistor M1 may be in a range between about 2 to about 4.

That is, when the ratio (Cst/Cx) of the size of the storage capacitor Cst to the size of the capacitor Cx of the gate insulating layer of the driving transistor M1 is less than 4, performance of the pixel array test is possible. When the ratio (Cst/Cx) is greater than 2, the pixel array test is possible and the image quality of the display panel of the product is such that a superior product may be generated.

Figure 4:
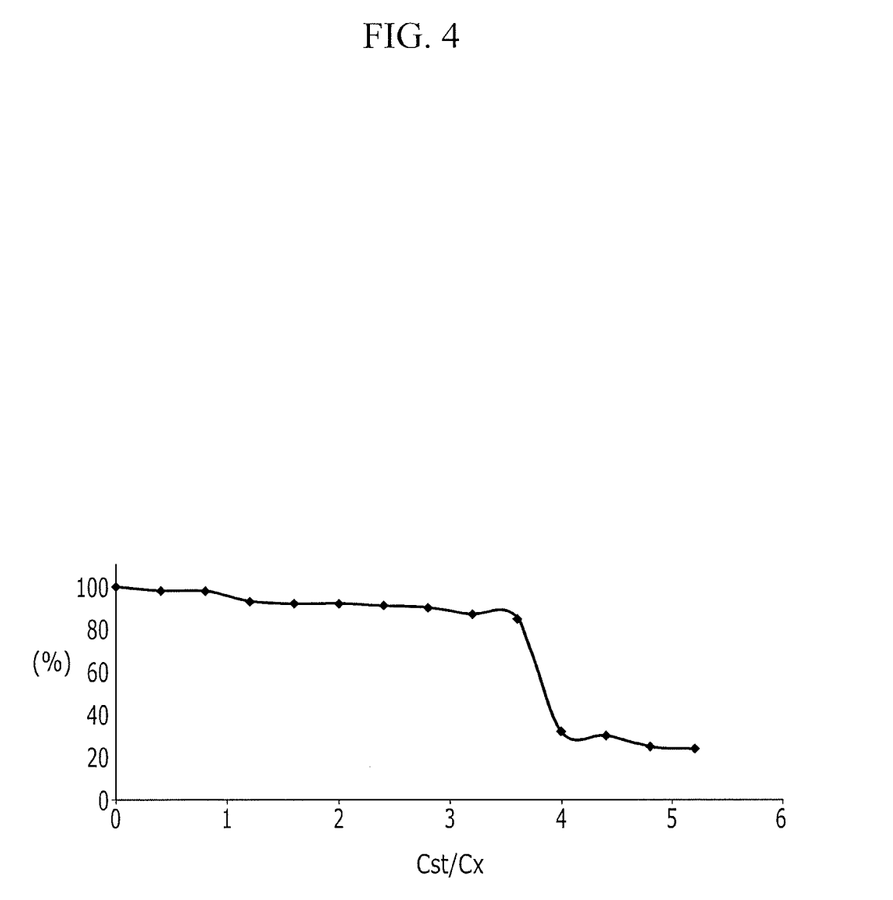
FIG. 4 illustrates a graph showing a detection success ratio of a pixel array according to a size ratio of the capacitor included in the pixel of FIG. 1.
Figure 5:
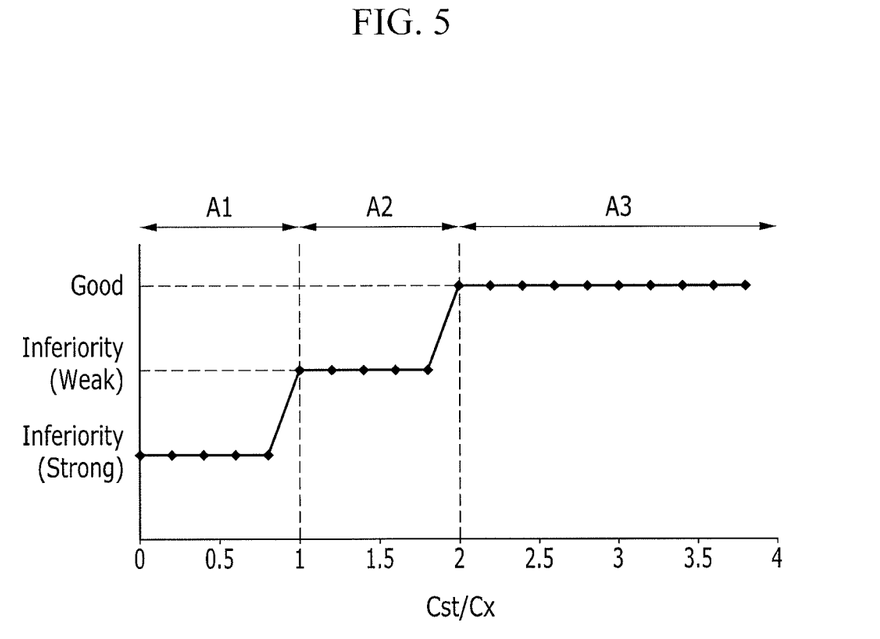
FIG. 5 illustrates a graph showing a detection inferiority rate of a pixel array according to a size ratio of the capacitor included in the pixel of FIG. 1.

Graphs of FIG. 4 and FIG. 5 show a threshold means of the ratio (Cst/Cx) of the size of the storage capacitor Cst to the size of the capacitor Cx of the gate insulating layer. FIG. 4 is a graph showing a detection success ratio of a pixel array according to a size ratio of the capacitor included in the pixel of FIG. 1, and FIG. 5 is a graph showing a detection inferiority rate of a pixel array according to a size ratio of the capacitor included in the pixel of FIG. 1.

Referring to FIG. 4, a horizontal axis is the ratio (Cst/Cx) of two capacitors connected to the first node N1 of the pixel of FIG. 1, and a vertical axis shows a detection success ratio (%) of the inferiority for the array substrate including the pixel like FIG. 1.

As the ratio of the size of the storage capacitor Cst for the size of the capacitor Cx of the gate insulating layer is increased, the detection success ratio for the array is decreased, and at this time, the detection success ratio of about 80% appears until about 3.8. When being over 4, the array detection success ratio is quickly decreased to about 20% such that the performance of the array test process may be possible, but may be difficult, when the size of the storage capacitor Cst is more than 4 times the size of the gate insulating layer of the driving transistor. Accordingly, it is determined that the size of the storage capacitor is less than about 4, e.g., exactly 4, times the size of the gate insulating layer of the driving transistor to constitute the pixel circuit.

According to FIG. 4, in the range that the ratio of the size of both capacitors is less than about 4, the array detection success ratio may be excellent.

Referring to FIG. 5, the horizontal axis is the ratio (Cst/Cx) of the size of both capacitors connected to the first node N1 of the pixel of FIG. 1, and the vertical axis is an approximate detection result of the inferiority for the array substrate including the pixel like FIG. 1.

As confirmed in FIG. 4, the array detection success ratio is excellent in the range in which the ratio of the size of both capacitors is less than about 4. However, referring to FIG. 5, an inferiority may be generated for the quality of the display panel in the ranges A1 and A2 in which the ratio (Cst/Cx) is less than about 2, e.g., exactly 2, so that it may be difficult to be produce a quality product. In detail, in the range A1, in which the ratio (Cst/Cx) of the size of the storage capacitor Cst to the size of the capacitor Cx of the gate insulating layer is in the range between 0 to about 1, a serious spot may be generated in the display panel so that the display panel is determined to be an inferior product, e.g., a strongly inferior product. In the range A2 above 1 and less than about 2, the spot may also be generated in the display panel so that the display panel may be determined to be an inferior product, e.g., a weakly inferior product.

Referring to FIG. 5, in the range A3 in which the ratio (Cst/Cx) of the size of the storage capacitor Cst for the size of the capacitor Cx of the gate insulating layer is in the range between about 2 to about 4 the spot is slightly generated such that the display panel is determined to be sufficiently good so as to be a quality product.

Accordingly, the size ratio (Cst/Cx) of the capacitors that are capable of being produced as a product in the manufacturing process of the display panel and simultaneously obtaining the detection success of a predetermined degree through the ratio array test process may be determined in the range between about 2 to about 4, e.g., between exactly 2 to exactly 4.

As shown in an exemplary embodiment, the size ratio of the gate insulating layer of the driving transistor M1 and the storage capacitor Cst is determined in the range between 2 to 4 to form the pixel of FIG. 1 so that, e.g., the inferiority of the capacitor that is weak in five masks may be easily detected in the array test process, and this may largely improve the production yield of the display device.

By way of summation and review, in the organic light emitting diode display, transmission of a driving current of the organic light emitting diode may be controlled by a transistor included in each pixel circuit. Therefore, if the transistor of the pixel circuit is abnormally operated, or a wire is disconnected or short-circuited, a predetermined driving current may not be applied to the organic light emitting diode. Accordingly, the normal operation of the transistors included in the pixel circuit should be tested to repair defects, or to not progress with a panel process and a module process (e.g., before forming the organic light emitting diode) when the defects cannot be repaired in terms of manufacturing time and/or cost.

Further, a short of a capacitor having a high inferiority rate among the constitution elements of the pixel circuit could be detected in the array test process. Therefore, optimization of a pixel circuit of a light emitting device that is capable of easily performing and correctly testing a display on a pixel circuit array and an array test method of the pixel are sought.

Accordingly, embodiments relate to a pixel and a test method for a pixel array, and more particularly to a pixel circuit enabling an array test and product quality in a large size display panel, and an array test method thereof. Further, exemplary embodiments provide a pixel circuit that is optimized to correctly detect performance of a pixel circuit array. Also, a test method for a pixel array, according to exemplary embodiments, has the optimized circuit structure provided.

A pixel having a circuit element that is optimized for the pixel array test process, e.g., in a large size display panel, may be provided, according to embodiments. For example, the capacitor of the pixel circuit may be constituted in the optimized range so that an error according to a short of the capacitor having a high inferiority rate in the product manufacturing process may be correctly detected in the array test process. Accordingly, the test method for the pixel array including the pixel circuit may detect the error of the capacitor that is weak in the five masks, thereby largely improving the production yield.

The drawings and the detailed description described above are examples and are provided to explain the exemplary embodiments, and the scope of the present invention described in the claims is not limited thereto. Therefore, it will be appreciated to those skilled in the art that various modifications may be made and other equivalent embodiments are available. Further, a person having ordinary skill in the art can omit some of the constituent elements described in the specification without deteriorating performance or can add constituent elements in order to improve performance. In addition, a person having ordinary skill in the art may change the sequence of the steps described in the specification according to process environments or equipment. Accordingly, the scope of the present invention should be determined not by the above-described exemplary embodiments, but by the appended claims and their equivalents.

What is claimed is:

1. A method of testing a pixel array for a pixel including a driving transistor to control a supply of a driving current to an organic light emitting diode according to a scan signal and a storage capacitor connected to the driving transistor, the method comprising:
   receiving the pixel array including the pixel;
   irradiating an electron beam to an anode of the organic light emitting diode before completing manufacture of the organic light emitting diode; and
   testing an inferiority existence of the storage capacitor based on a detection amount of secondary electrons emitted from the anode, wherein testing the inferiority existence of the storage capacitor includes determining a ratio of a normal voltage to an abnormal voltage based on the detection amount of the secondary electrons, and wherein a ratio of a size of a capacitance of the storage capacitor to a size of capacitance of a gate insulating layer of the driving transistor is manufactured to be in a predetermined range for detection of a defective state of the storage capacitor.

2. The method of claim 1, wherein the gate insulating layer of the driving transistor is arranged between an active layer and a gate metal layer of the driving transistor.

3. The method of claim 1, wherein the size of the capacitance of the storage capacitor is about 2 times to about 4 times the size of the capacitance of the gate insulating layer of the driving transistor.

4. The method of claim 1, wherein irradiating the electron beam to the anode of the organic light emitting diode is performed before an light emitting layer is coupled to the anode.

5. A method of testing a pixel, the method comprising:
   receiving a pixel array including the pixel;
   irradiating an electron beam to an anode of an organic light emitting diode of the pixel before completing manufacture of the organic light emitting diode; and
   testing an inferiority existence of a storage capacitor of the pixel based on a detection amount of secondary electrons emitted from the anode, a size of a capacitance of the storage capacitor to a size of capacitance of a gate insulating layer of a driving transistor coupled to the storage capacitor is manufactured to be in a predetermined range for detection of a defective state of the storage capacitor, wherein the testing of the inferiority existence of the storage capacitor includes determining a ratio of a normal voltage to an abnormal voltage based on the detection amount of the secondary electrons, the ratio being a function of the capacitances of the storage capacitor and the gate insulating layer.

6. The method of claim 5, wherein
the storage capacitor and the gate insulating layer are coupled in series, and
the ratio of the normal voltage to the abnormal voltage based on the detection amount of the secondary electrons is C1/(C1+C2), C1 being the capacitance of the storage capacitor and C2 being the capacitance of the gate insulating layer.

7. The method of claim 5, wherein the capacitance of the storage capacitor is about 2 times to about 4 times the capacitance of the gate insulating layer.

8. A method for testing a pixel, the method comprising:
irradiating a beam onto an electrode of an organic light emitting diode of the pixel before completing manufacture of the organic light emitting diode;
determining a ratio of a normal voltage to an abnormal voltage based on a detection amount of secondary electrons produced by the beam; and
testing existence of an inferiority of a storage capacitor of the pixel based on the ratio of the normal and abnormal voltages, wherein the ratio is a function of a capacitance of the storage capacitor and a capacitance of a gate insulating layer of a driving transistor of the pixel.

9. The method of claim 8, wherein:
the storage capacitor and the gate insulating layer are coupled in series, and
the ratio of the normal voltage to the abnormal voltage based on the detection amount of the secondary electrons is a function of C1/(C1+C2), where C1 is the capacitance of the storage capacitor and C2 is the capacitance of the gate insulating layer.

10. The method of claim 8, wherein the capacitance of the storage capacitor is about 2 times to about 4 times the capacitance of the gate insulating layer.

* * * * *